United States Patent [19]
Chillara et al.

[11] Patent Number: 5,648,679
[45] Date of Patent: *Jul. 15, 1997

[54] TAPE BALL LEAD INTEGRATED CIRCUIT PACKAGE

[75] Inventors: Satya Chillara; Shahram Mostafazadeh, both of San Jose, Calif.

[73] Assignee: National Semiconductor Corporation, Santa Clara, Calif.

[*] Notice: The term of this patent shall not extend beyond the expiration date of Pat. No. 5,569,955.

[21] Appl. No.: 511,395

[22] Filed: Aug. 4, 1995

Related U.S. Application Data

[63] Continuation-in-part of Ser. No. 406,726, Mar. 20, 1995, Pat. No. 5,569,955, which is a continuation-in-part of Ser. No. 307,270, Sep. 16, 1994, Pat. No. 5,442,230.

[51] Int. Cl.⁶ .................................................. H01L 23/02
[52] U.S. Cl. ........................ 257/666; 257/693; 257/700; 257/701
[58] Field of Search .................................. 257/666, 693, 257/700, 701

[56] References Cited

U.S. PATENT DOCUMENTS

5,569,955  10/1996  Chillara et al. ...................... 257/666

*Primary Examiner*—Sara W. Crane
*Assistant Examiner*—Roy Potter
*Attorney, Agent, or Firm*—Hickman Beyer & Weaver

[57] ABSTRACT

An integrated circuit assembly includes a dielectric flex tape substrate defining a predetermined array of electrically conductive traces and an array of solder balls or solder columns electrically connected to the bottom surface of the flex tape substrate and the traces. An integrated circuit die having a series of input/output pads is supported on the substrate. In one embodiment, a plurality of electrically conductive leads are supported by the flex tape substrate in electrical isolation from and over the conductive traces. A first and second series of bonding wires electrically connect certain ones of the input/output terminals on the integrated circuit die to the electrically conductive leads and conductive traces, respectively. In other embodiments, one or more electrically isolated conductive layers are supported by the dielectric flex tape substrate over the traces and electrically conductive leads. The integrated circuit package assembly, in accordance with any of these embodiments, provides a very high density electrical interconnection arrangement for the integrated circuit die while retaining a small package footprint.

14 Claims, 9 Drawing Sheets

TAPE BALL LEAD INTEGRATED CIRCUIT PACKAGE

This application is a continuation-in-part of U.S. patent application Ser. No. 08/406,726, filed Mar. 20, 1995 now U.S. Pat. No. 5,569,955 which is a continuation-in-part of U.S. patent application Ser. No. 08/307,270, filed Sep. 16, 1994, now U.S. Pat. No. 5,442,230 which are incorporated herein by reference.

BACKGROUND OF THE INVENTION

The present invention relates generally to an integrated circuit assembly, and more particularly to an assembly wherein a plurality of leadframe leads are supported on a dielectric substrate, itself defining a plurality of electrically conductive traces. The leadframe leads are electrically isolated from the conductive traces. The assembly may also include one or more electrically conductive layers supported by the substrate and used for additional electrical interconnections.

In the field of integrated circuits, the physical size of an integrated circuit assembly is a primary concern. As technology has improved and functionality of integrated circuit chips has increased, the number of electrical interconnections required by a typical individual IC chip within an integrated circuit assembly has steadily increased. Very high density electrical interconnection arrangements within the integrated circuit package are now required to provide the needed number of electrical connections to interface the integrated circuit chip to the outside world. At the same time, the need for the overall integrated circuit assembly to retain as small a footprint as possible remains a primary consideration. In the prior art, a leadframe was typically used to provide electrical connections to the IC chip. As higher numbers of connections were required, the width of individual leadframe leads was simply decreased and the spacing between the leads was also decreased, thereby increasing the number of leads per inch. This is an acceptable solution up to a point. As the width of the leads and the spacing therebetween is decreased, the IC assembly becomes increasingly more difficult to manufacture and the reliability of the assembly is reduced. Therefore, other solutions have been proposed, as will be discussed immediately below.

Figure 1:
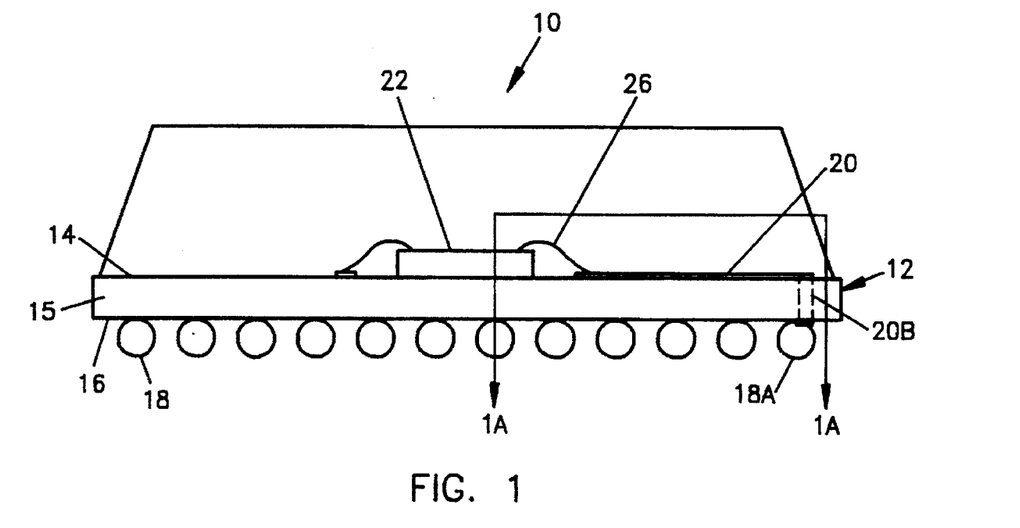
FIG. 1 is an elevational diagrammatic illustration of an integrated circuit assembly according to the prior art.
Figure 1A:
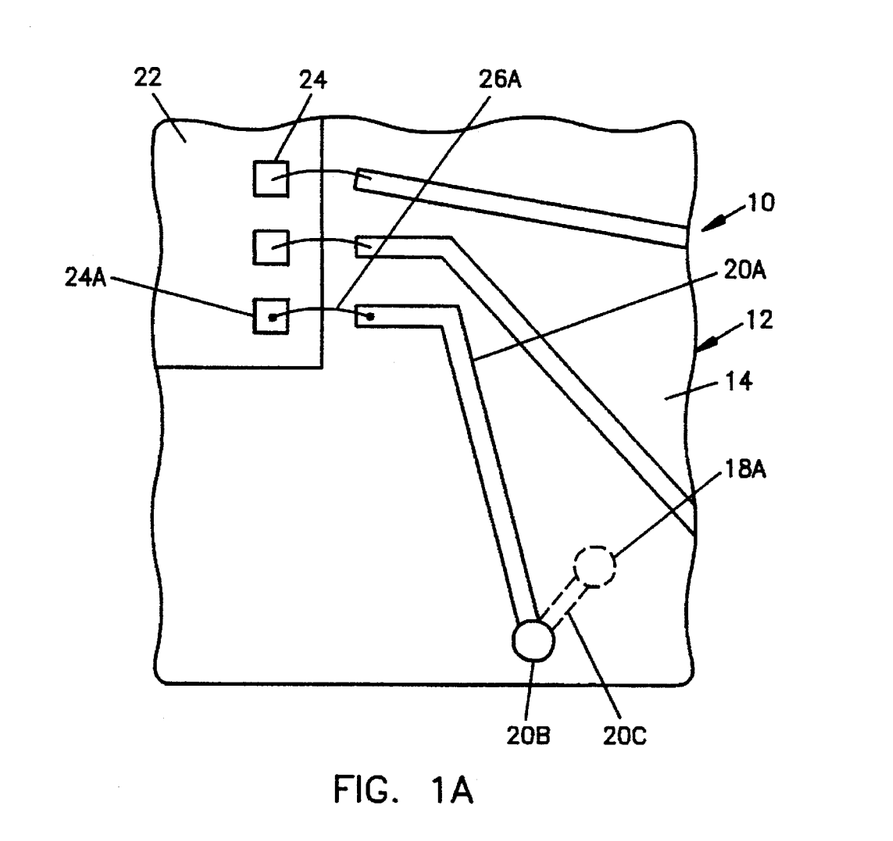
FIG. 1A is a diagrammatic sectional plan view of the assembly of FIG. 1.

FIGS. 1 and 1A illustrate a prior art integrated circuit assembly generally indicated by the reference numeral 10. The assembly utilizes an arrangement which does not include a leadframe but, nevertheless attempts to achieve a high density of electrical interconnections. The assembly includes a dielectric substrate 12 having a top surface 14, a side surface 15 and a bottom surface 16. A plurality of solder balls 18 are attached to bottom surface 16 in a grid array. Substrate 12 defines a plurality of electrically conductive traces, a representative example of which is shown at reference numeral 20. Conductive trace 20 comprises a first portion 20A integral with top surface 14 of the substrate, a second portion 20B which is a via that goes through the substrate and a third portion 20C integral with the bottom surface 16 of the substrate. As may be seen in the figures, conductive trace 20 is routed from the top surface of the substrate to the bottom surface through the via 20b.

An IC chip 22 having a plurality of input/output pads 24 is supported on top surface 14 of the substrate. A plurality of bonding wires 26 electrically connect the input/output pads on IC chip 22 to the conductive traces. For example, bonding wire 26A is electrically connected to input/output pad 24A on IC 22 at one end and at its other end is electrically connected to conductive trace 20A. Solder ball 18A is electrically connected to the third portion of conductive trace 20A on the bottom surface of the substrate, whereby input/output pad 24A is electrically connected to solder ball 18A by means of bonding wire 26A and conductive trace 20. Each respective solder ball within the grid array is electrically connected to a respective input/output pad on the IC chip in this manner.

This prior art assembly, illustrated in FIGS. 1 and 1A allows for a significant number of electrical interconnects and, since the solder balls 18 may be distributed over the entire bottom surface 18, the problems with interconnection to very fine leadframe leads, as discussed above, are avoided. Nevertheless, the number of interconnections possible using this approach is still quite limited, given the advancements in IC chip technology. As will be described hereinafter, the present invention provides for an arrangement which is capable of almost doubling the number of reliable electrical interconnections which are possible without enlarging the footprint of the IC assembly.

SUMMARY OF THE INVENTION

As will be described in more detail hereinafter, an integrated circuit package assembly utilizing both leads and a grid array of contacts attached to the bottom of the package to provide an arrangement for electrically connecting the integrated circuit package to other electrical elements is disclosed. The integrated circuit package includes a dielectric flex tape substrate having a horizontal top surface, a horizontal bottom surface, a plurality of contact terminals on the bottom surface of the flex tape substrate, a plurality of terminal pads on the top surface of the flex tape substrate, and a plurality of traces. Each of the traces electrically connects a respective one of the contact terminals on the bottom of the substrate to an associated one of the terminal pads on the top surface of the substrate. An integrated circuit die is supported by the top surface of the flex tape substrate and the integrated circuit die includes a plurality of input/output terminals. A plurality of electrically conductive leads are supported by the top surface of the flex tape substrate and are electrically isolated from the traces of the flex tape substrate. The electrically conductive leads are adapted to electrically connect certain ones of the plurality of input/output terminals of the integrated circuit die to external electrical elements. An array of electrically conductive contacts are attached to the contact terminals on the bottom surface of the flex tape substrate. The contacts are adapted to electrically connect certain other ones of the plurality of input/output terminals of the integrated circuit die to external electrical elements. A first array of bonding wires electrically connects the certain ones of the plurality of input/output terminals of the integrated circuit die to associated one of the electrically conductive leads supported on the top surface of the flex tape substrate. A second array of bonding wires electrically connects the certain other ones of the plurality of input/output terminals of the integrated circuit die to associated ones of the terminal pads on the top surface of the flex tape substrate. And, an encapsulating material is integrally formed around and encapsulates at least the top surface of the flex tape substrate, the integrated circuit die, portions of the electrically conductive leads, and the first and second arrays of bonding wires.

In one preferred embodiment, the integrated circuit package assembly further includes a relatively rigid stiffener member attached to the top surface of the flex tape substrate. The stiffener member is attached to and is electrically isolated from the electrically conductive leads. In this embodiment, the stiffener member may be constructed of a thermally conductive material, thereby providing a heat spreader for improving the heat dissipating characteristics of the integrated circuit package assembly.

In accordance with a third embodiment of the present invention, first and second conductive layers are positioned in a stacked relationship and supported on the leads over at least some of the conductive traces and leads. Each of the respective conductive layers is electrically interconnected to the IC chip by means of bonding wires, and each conductive layer is electrically connected to any predetermined respective lead or respective conductive trace in accordance with a predetermined circuit design wherein the layers may function as, for example, power and ground planes, respectively.

All embodiments of the present invention herein disclosed achieve a very high density of electrical interconnections for the IC chip while, at the same time, the package footprint is typically smaller than that of a prior art leadframe based package having an identical pin count. It should be noted that in the embodiments of the present invention wherein one or more electrically conductive layers are used as power or ground planes, an improvement in the electrical performance of the integrated circuit assembly can be realized to a decrease in the inductance of the power and ground interconnections. This advantage is achieved and maximized by keeping the bonding wires which interconnect the conductive planes to the IC chip and power source terminations as short as possible.

BRIEF DESCRIPTION OF THE DRAWINGS

The present invention may be understood by reference to the following detailed description taken in conjunction with the drawings in which.

DETAILED DESCRIPTION OF THE INVENTION

Figure 2:
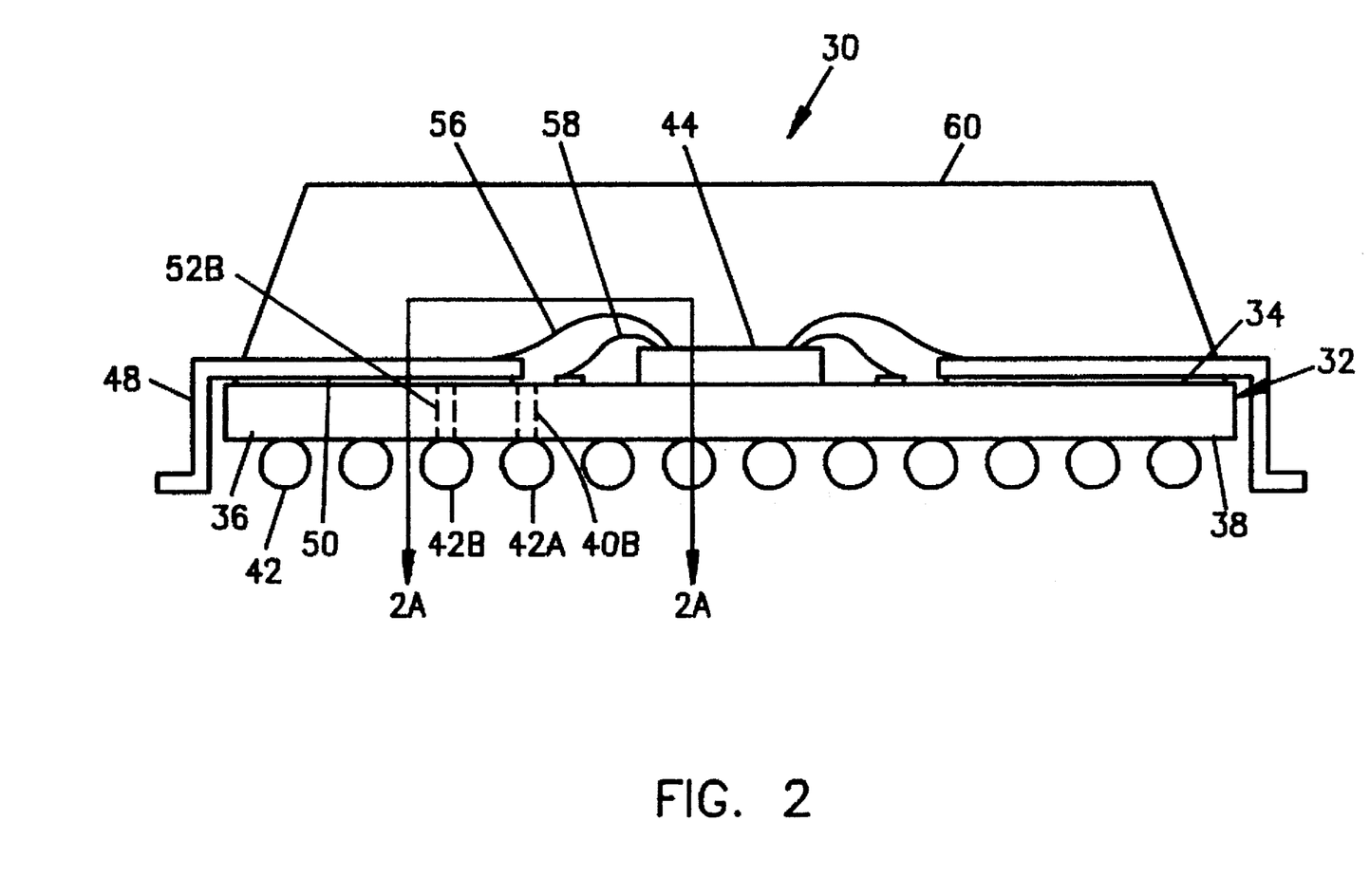
FIG. 2 is an elevational diagrammatic illustration of an integrated circuit assembly designed in accordance with a first embodiment of the present invention.
Figure 2A:
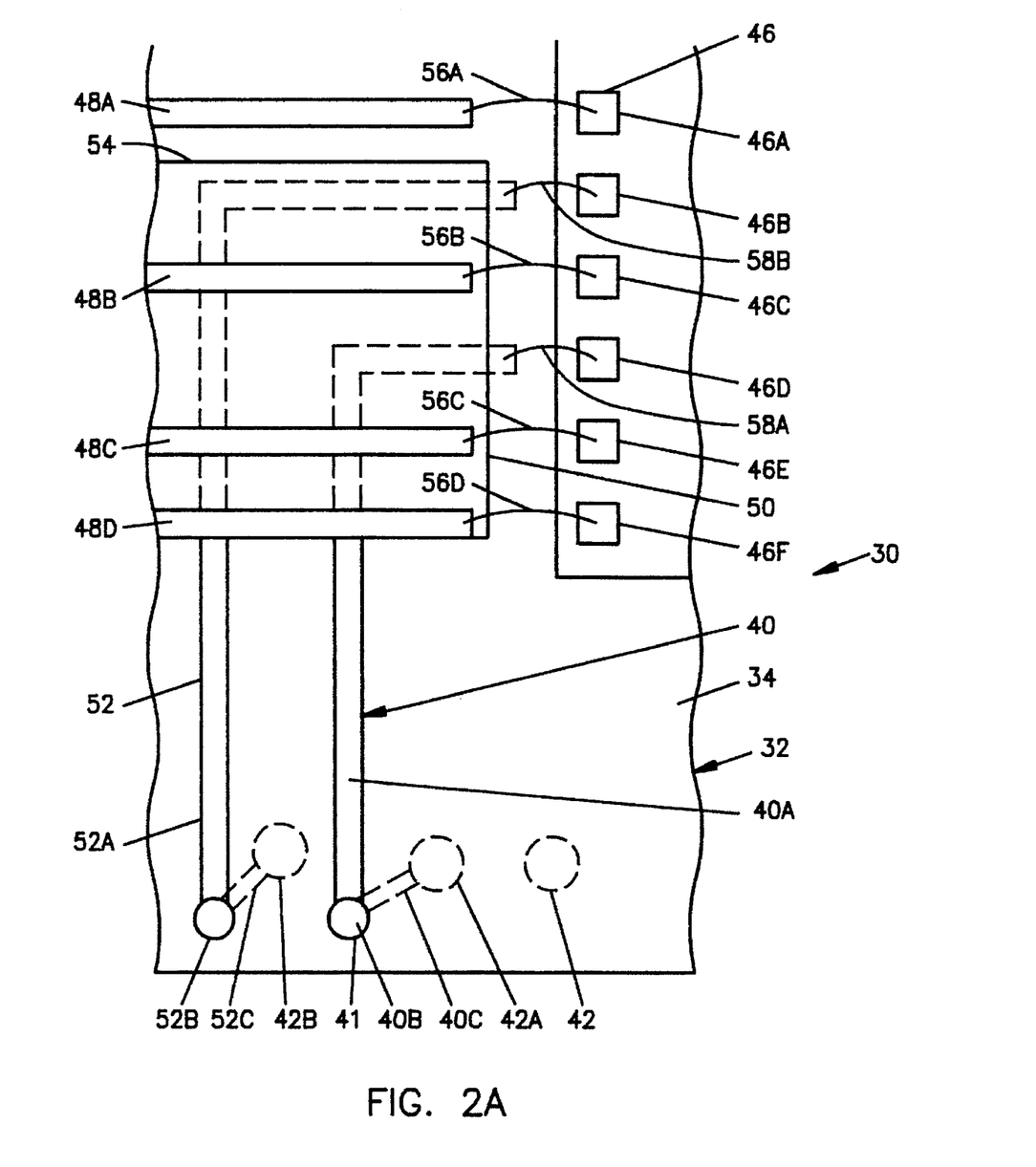
FIG. 2A is a diagrammatic sectional plan view of the assembly of FIG. 2.

Having described FIGS. 1 and 1A previously, attention is immediately directed to FIGS. 2 and 2A, which illustrate an integrated circuit assembly generally designated by the reference numeral 30 and designed in accordance with the present invention. The assembly includes a dielectric substrate 32 having a top surface 34, a side surface 36, and a bottom surface 38. The substrate 32 defines a plurality of conductive traces, one of which is shown at 40. As may be seen in FIGS. 2 and 2A, conductive trace 40 comprises a first portion 40A integral with the top surface 34 of substrate 32, a second portion 40B passing through a via 41 extending from the top surface to the bottom surface of substrate 32, and a third portion 40C, integral with the bottom surface 38 of the substrate 32. A plurality of solder balls 42 are attached to the bottom surface 38 of the substrate 32. A respective solder ball 42A is electrically connected to third portion 40C of conductive trace 40 on bottom surface 38 of the substrate. The particular trace shown here is routed from top surface 34 to bottom surface 38 through via 41. It should be understood that conductive traces may be routed from the top surface to the bottom surface of the substrate around the side of the substrate. Any of these means are compatible with the present invention and may be used in any embodiment of the present invention to electrically route the conductive traces from the top surface to the bottom surface of the substrate where they are connected to respective solder balls.

The assembly further includes an IC chip 44 supported on top surface 34 of the substrate wherein the IC chip includes a series of input/output pads: 46A, 46B, 46C, 46D, 46E and 46F. In accordance with the present invention, a plurality of leadframe leads 48A, 48B, 48C and 48D are supported by the substrate on top surface 34 in electrically isolated relationship with traces 40. In some, if not all cases, these leadframe leads cross over adjacent underlying traces. For example, the leadframe leads 48C and 48D shown in FIG. 2A overlie conductive trace portion 40A. The leadframe leads are electrically isolated from portion 40A of conductive trace 40 by a layer of insulating material 50, as illustrated in FIG. 2. A variety of insulating materials such as a dielectric tape or a non-conductive epoxy may be used to provide the electrical isolation between the leadframe leads 48C and 48D and first portion 40A of conductive trace 40. These materials may further serve to bond the leadframe leads to the substrate in accordance with the present invention. An additional conductive trace 52 having a first portion 52A integral with the top surface 34, a second portion 52B going through top surface 34 to bottom surface 38 and a third portion 52C integral with the bottom surface 38 of the substrate is shown in FIGS. 2 and 2A. Leadframe leads 48B, 48C and 48D overlie first portion 52A of conductive trace 52. These lead frame leads are also electrically isolated from the trace 52 by insulating material 50.

While the leadframe leads, as discussed above, generally overlie the conductive traces, selective placement and arrangement of leadframe leads on the substrate can provide electrical isolation of the leadframe leads from the conductive traces without the need for a dielectric layer. For example, leadframe lead 48A, in FIG. 2A, does not cross a conductive trace. A spaced relationship is maintained from leadframe lead 48A and portion 52A of conductive trace 52. As a result of this placement and arrangement of leadframe lead 48A, the leadframe lead is electrically isolated from the conductive traces and the electrical isolation provided by dielectric layer 50 is not needed between leadframe lead 48A and the substrate. Therefore, dielectric layer 50, as shown in FIG. 2A, includes an outer edge 54 with leadframe lead 48A arranged so as to be supported directly on top surface 34 of the substrate. Any leadframe lead may be isolated from the conductive traces in this manner. If all leadframe leads are so isolated by selective placement and arrangement upon the substrate to avoid crossing conductive trace and maintaining a spaced relationship between the leadframe leads and the conductive traces, dielectric layer 50 is not required and a production cost savings may be realized.

Still referring to FIGS. 2 and 2A, a first series of bonding wires 56 electrically connects the leadframe leads to selected ones of the input/output pads on IC chip 44. Bonding wire 56A electrically connects leadframe lead 48A to input/output pad 46A on IC chip 44. Bonding wires 56B, 56C and 56D similarly electrically connect leadframe leads 48B, 48C and 48D to respective ones of the input/output pads 46C, 46E and 46F on IC chip 44. A second series of bonding wires 58 electrically connect the conductive traces to respective ones of the bonding pads on IC chip 44. Bonding wire 58A electrically connects first portion 40A of conductive trace 40 to input/output pad 46D. Bonding wire 58B electrically connects portion 52A of conductive trace 52 to input/output pad 46B. Conductive trace 52 is routed from top surface 34 to bottom surface 38 of substrate 32 by second portion 52B of trace 52. The trace further continuing on bottom surface 38 of the substrate where it is electrically connected to solder ball 42B. The IC assembly is partially encapsulated in a dielectric medium 60.

Figure 3:
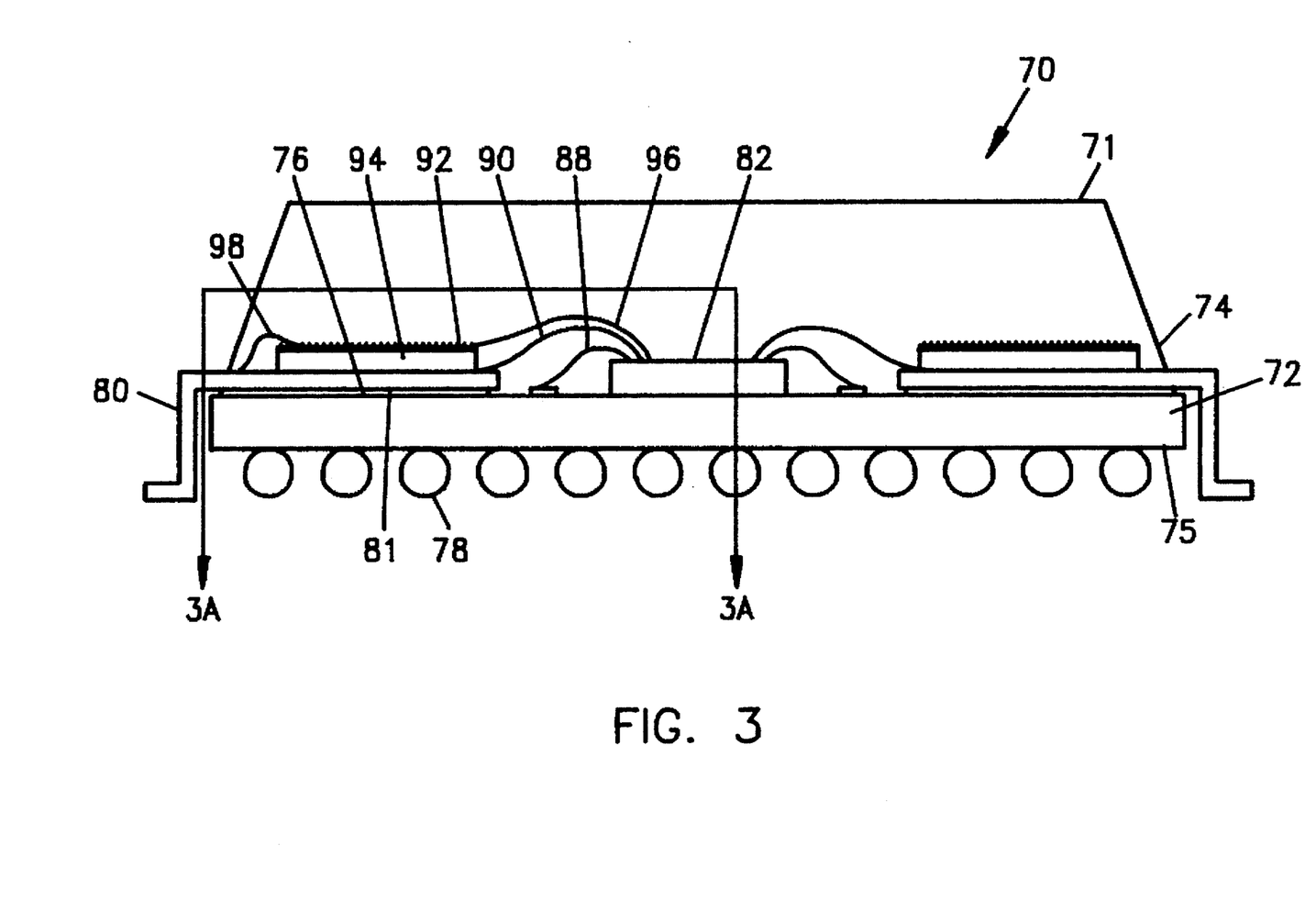
FIG. 3 is an elevational diagrammatic illustration of an integrated circuit assembly designed in accordance with a second embodiment of the present invention.
Figure 3A:
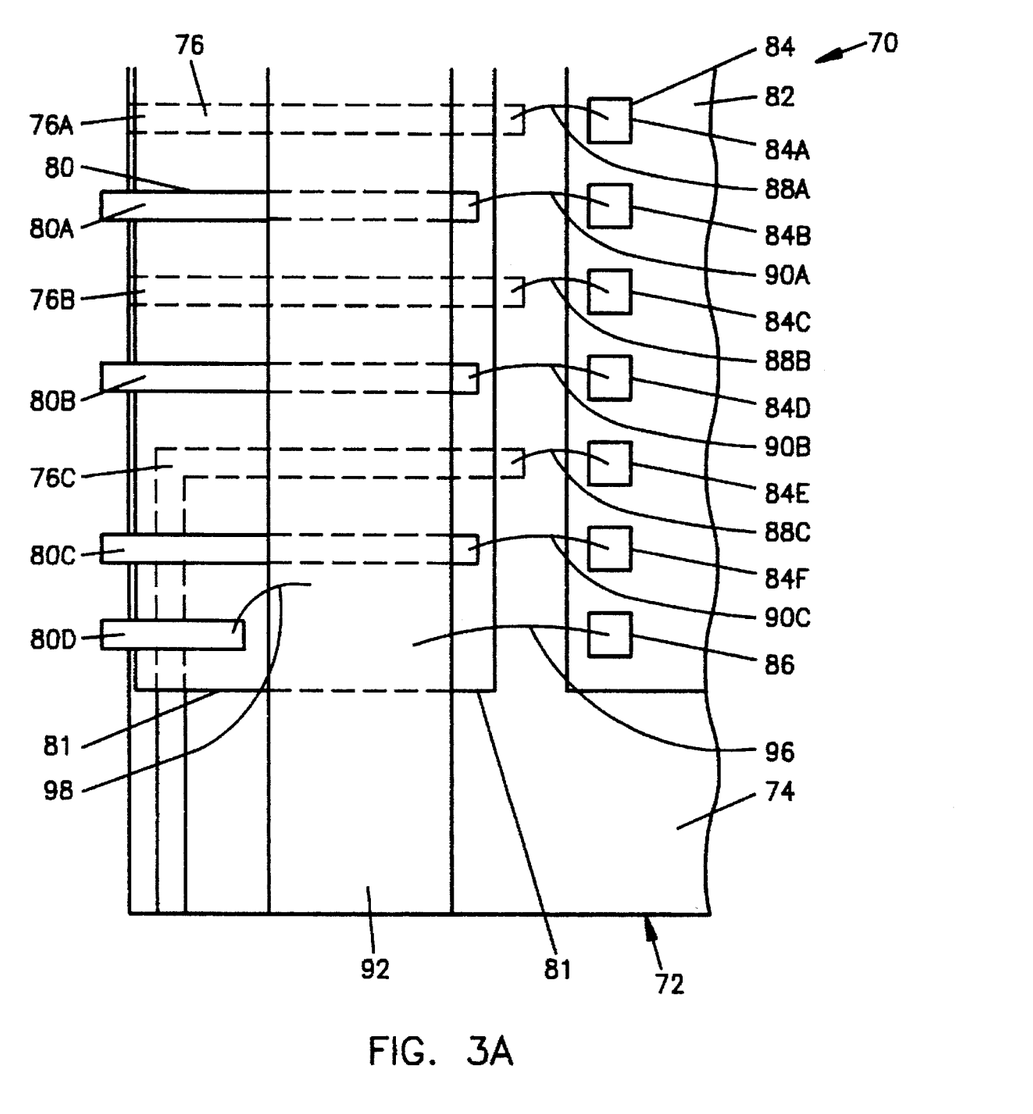
FIG. 3A is a diagrammatic sectional plan view of the assembly of FIG. 3.

FIGS. 3 and 3A illustrate an integrated circuit assembly, generally designated by the reference numeral 70. The assembly is partially encapsulated in a dielectric medium 71. The assembly includes a dielectric substrate 72 having a top surface 74 and a bottom surface 75. The substrate defines a plurality of electrically conductive traces 76. A plurality of solder balls 78 are attached to bottom surface 75 of the substrate and each conductive trace 76 is electrically attached to a respective one of the solder balls as previously described in the discussion referring to FIGS. 2 and 2A. In accordance with the present invention, a plurality of leadframe leads 80 are supported by substrate 72 on its upper surface 74. An insulating layer 81 electrically insulates the leadframe leads from the conductive traces in the case where the leadframe leads overlie the traces. In fact, whether or not the leads cross over traces, layer 81 extends between substrate 72 (including all traces) and the entire leadframe. For example, leadframe leads 80C and 80D overlie conductive trace 76C as shown in FIG. 3A, but due to the presence of insulating layer 81 electrical isolation is maintained between these leadframe leads and conductive trace 76C there below, as described previously. An IC chip 82 having a series of input/output pads 84 is supported on the upper surface 74 of substrate 72. The IC chip also includes an additional terminal 86, which may be, for example, a power or ground terminal in accordance with the present invention. A first series of bonding wires 88 electrically connect the conductive traces to respective ones of the input/output pads on IC chip 82. Bonding wires 88A, 88B and 88C each electrically connect a respective one of conductive traces 76A, 76B and 76C to a respective one of input/output pads 84A, 84C and 84E. A second series of bonding wires 90 electrically connect the leadframe leads to respective ones of the input/ output pads on IC chip 82. Bonding wires 90A, 90B and 90C each electrically connect a respective one of leadframe leads 80A, 80B and 80C to a respective one of input/output pads 84B, 84D and 84F.

In accordance with the present invention, an electrically conductive layer 92 is supported on upper surface 74 of substrate 72 over at least some of leadframe leads 76 and, in a preferred embodiment, serves as either a power or ground plane. As may be seen in FIG. 3A, conductive layer 92 overlies leadframe leads 80A, 80B and 80C. Conductive layer 92 is electrically isolated from the leadframe leads by an insulating layer 94 disposed between the leadframe leads and the conductive layer. A variety of materials may be used within the scope of the present invention as insulating layer 94. Dielectric tape and non-conductive epoxy are several examples of materials suited to function as the insulating layer. The insulating layer may further serve to bond conductive layer 92 to the substrate, as is the case with both nonconductive epoxy and dielectric tape. If other materials are used for the insulating layer a separate adhesive may be used as a bonding agent.

A bonding wire 96 electrically connects additional terminal 86 of IC chip 82 to electrically conductive layer 92. A bonding wire 98 electrically connects leadframe lead 80D to electrically conductive layer 92 whereby additional terminal 86 of IC chip 82 is electrically connected to the leadframe lead via the bonding wire and the electrically conductive layer. In the case where conductive layer 92 serves as either a power or ground pane, bonding wires 96 and 98 should be kept as short as possible to minimize inductance in these interconnections. It is mentioned here that bonding wire 98 may alternatively be electrically connected from a preselected one of the conductive traces such as 76B to the conductive layer 92 (not shown). In fact, the conductive layer may be electrically connected to any conductive trace or leadframe lead, within the scope of the present invention. Leadframe lead 80D may be at ground potential in which case the electrically conductive layer 92 will serve as a ground plane and the additional terminal 86 on IC chip 82 is grounded or leadframe lead 80D may alternatively represent a power terminal in which case conductive layer 92 will serve as a power plane and the additional terminal 86 of IC chip 82 is a power terminal in accordance with a predetermined circuit design and within the scope of the invention.

Figure 4:
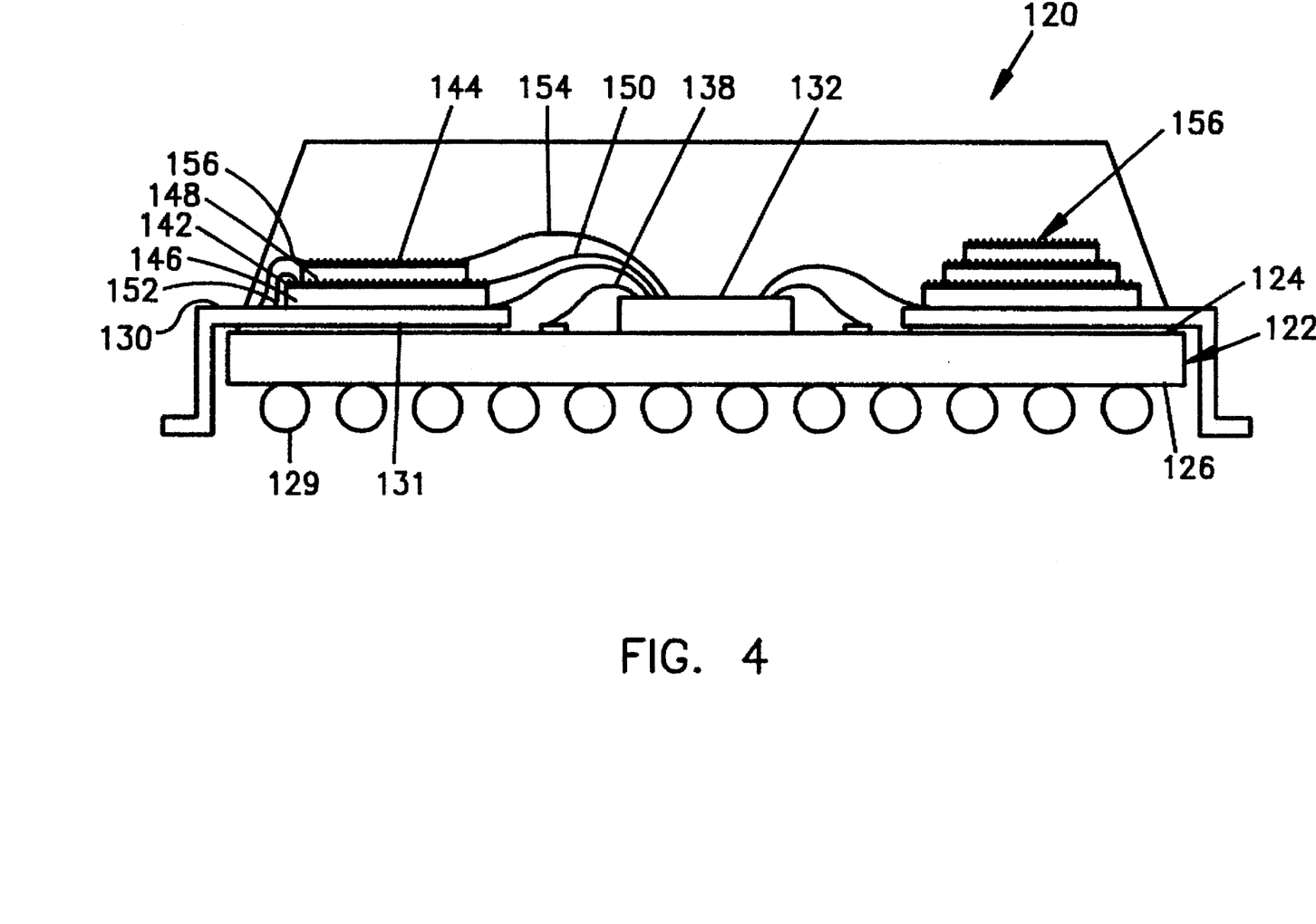
FIG. 4 is an elevational diagrammatic illustration of an integrated circuit assembly designed in accordance with a third embodiment of the present invention.
Figure 4A:
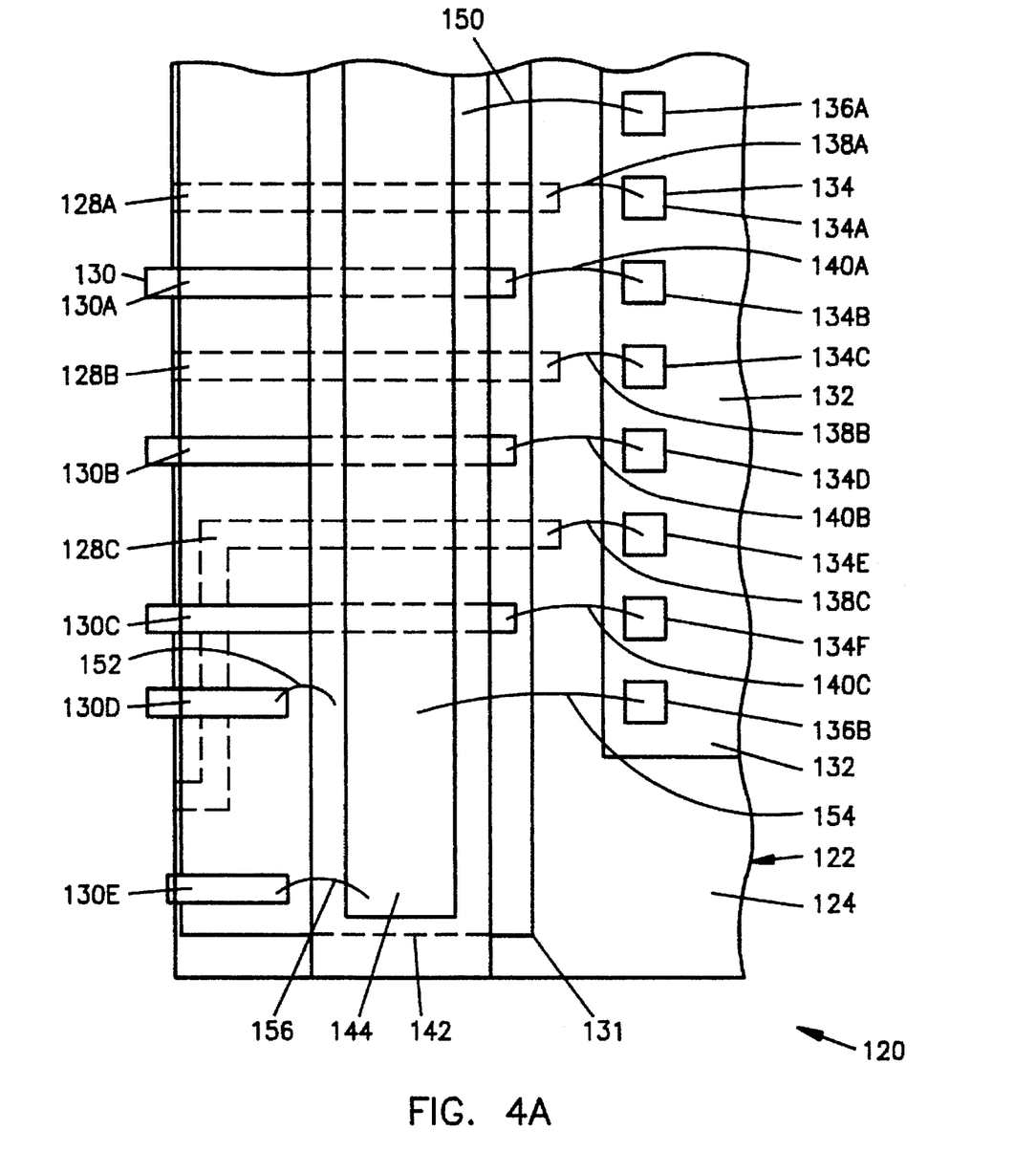
FIG. 4A is a diagrammatic sectional plan view of the assembly of FIG. 4.

The IC circuit assembly shown in FIGS. 4 and 4A depicts still another embodiment of the present invention. These figures illustrate an integrated circuit assembly generally designated by the reference numeral 120. The assembly includes a dielectric substrate 122 having a top surface 124 and a bottom surface 126. The substrate defines a plurality of electrically conductive traces 128. A plurality of solder balls 129 are attached to bottom surface 126 of the substrate and each conductive trace 128 is electrically attached to a respective one of solder balls 129, as previously described in the discussion referring to FIGS. 2 and 2A. A plurality of leadframe leads 130 are supported by substrate 122 on its upper surface 124. An insulating layer 131 electrically isolates the leadframe leads from the conductive traces. For example, leadframe leads 130C and 130D overlie conductive trace 128C in FIG. 4A, but due to the presence of insulating layer 131 electrical isolation is maintained between these leadframe leads and conductive trace 128C there below. An IC chip 132 having a series of input/output pads 134 is supported on the upper surface 124 of substrate 122. In accordance with the present invention, the IC chip also includes at least two additional terminals 136A and 136B, which may be power and ground terminals in accordance with a predetermined circuit design. A first series of bonding wires 138 electrically connect certain ones of the conductive traces to respective ones of the input/output pads on IC chip 132. Bonding wires 138A, 138B and 138C each electrically connect a respective one of conductive traces 128A, 128B and 128C to a respective one of input/output pads 134A, 134C and 134E on the IC chip. A second series of bonding wires 140 electrically connect certain ones of the leadframe leads to respective ones of the input/output pads on IC chip 132. Bonding wires 140A, 140B and 140C each electrically connect a respective one of leadframe leads 130A, 130B and 130C to a respective one of input/output pads 134B, 134D and 134F.

In accordance with the present invention, a first electrically conductive layer 142 and a second electrically conductive layer 144 are positioned in a stacked relationship on the upper surface of substrate 122 over at least some of the leadframe leads 130. A first insulating layer 146 electrically insulates first conductive layer 142 from leadframe leads 130A, 130B, and 130C; and a second insulating layer 148 electrically insulates second conductive layer 144 from first conductive layer 146, wherein the layers are electrically isolated from one another and from the leadframe leads thereunder. As described previously, each individual layer 142 and 144 may be electrically connected to any respective conductive trace or leadframe lead available in the IC assembly using cooperating bonding wires described previously. The respective leadframe lead or conductive trace to which each conductive layer is electrically connected may comprise a power terminal or a ground terminal according to a predetermined circuit design and in accordance with the invention as claimed. For the purpose of illustration, first layer 142 will be electrically interconnected as a ground plane and second layer 144 will be electrically interconnected as a power plane in FIGS. 4 and 4A. First additional terminal 136A of IC chip 132 is electrically connected to first conductive layer 142 by bonding wire 150. Bonding wire 152 electrically connects first conductive layer 142 to leadframe lead 130D. If leadframe lead 130D is at ground potential, the first conductive layer is also at ground potential and comprises a ground plane, wherein a ground termination is provided to the IC chip by bonding wire 150. Second additional terminal 136B of IC chip 132 is electrically connected to second conductive layer 144 by bonding wire 154. Bonding wire 156 electrically connects second conductive layer 144 to leadframe lead 130E. If leadframe lead 130E is at power potential, the second conductive layer is also at power potential and comprises a power plane, wherein a power termination is provided to the IC chip via bonding wire 154. Bonding wires 150, 152, 154 and 156 should be kept as short as possible to minimize the inductance of the power and ground interconnections within the IC assembly. Also, the power and ground leads of the leadframe are short as it can be seen in FIG. 4A. The electrical interconnection of the first and second electrically conductive layers as shown illustrates one possible embodiment of the present invention. Many other embodiments for electrical interconnection of the electrically conductive layers are possible as taught by the disclosure herein. For example, a second stack of electrically isolated conductive layers 156 is supported on substrate 122 in the same manner as the stack comprised of layers 142 and 144. Either of these stacks and/or additional stacks may include two or more electrically isolated layers electrically connected to cooperating terminals on IC chip 132 and leadframe leads and/or traces in the manner described previously. Stack 156, which is shown including three such layers, is illustrated without bonding wires for purposes of simplicity. While the leadframe leads illustrated in the various embodiments may be provided in any suitable manner, one method to do so is to form a leadframe including leads and a die attach pad and thereafter eliminate the die attach pad.

Figure 5:
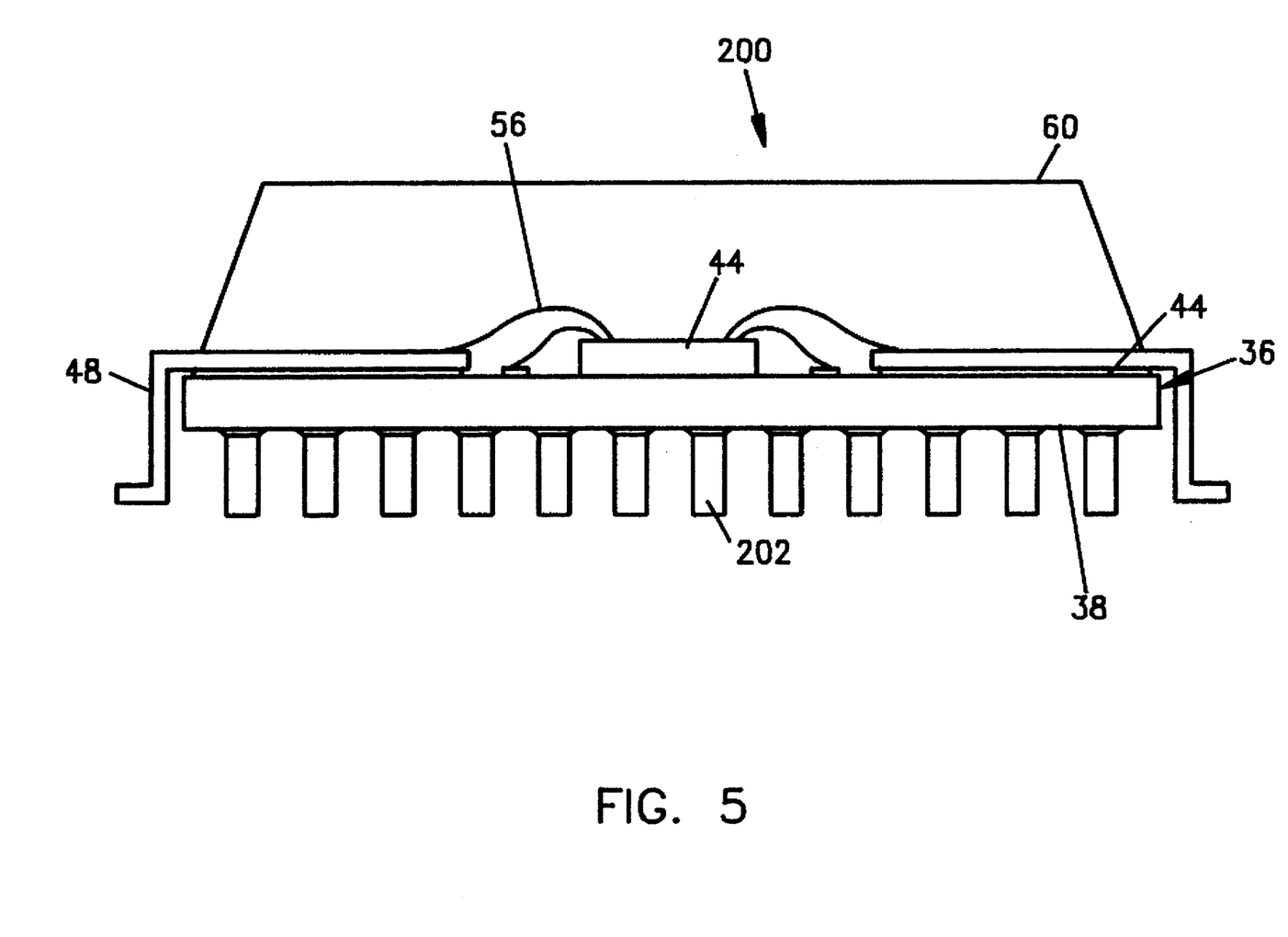
FIG. 5 is an elevational diagrammatic illustration of an integrated circuit assembly designed in accordance with a further embodiment of the present invention.

Referring now to FIG. 5, an assembly 200 designed in accordance to a further embodiment of the present invention is shown. Assembly 200 may be identical to assembly 30 illustrated in FIG. 2 and described above, with one exception. In place of the solder balls 42 forming part of assembly 30, assembly 200 uses elongated solder columns or attachment pins 202 connected to the underside of substrate 36 and traces 44 in the same manner as the solder balls. If solder columns are used a typical column might be 20 mils in diameter and 50–87 mils long. If attachment pins are used, a typical one might be 18 mils in diameter and 170 mils long. These dimensions are for illustrative purposes only and are not intended to limit the present invention. While not specifically shown, Assembly 200 could include the same stacked arrangement illustrated in FIGS. 3, 3A, 4 and 4A.

Figure 6:
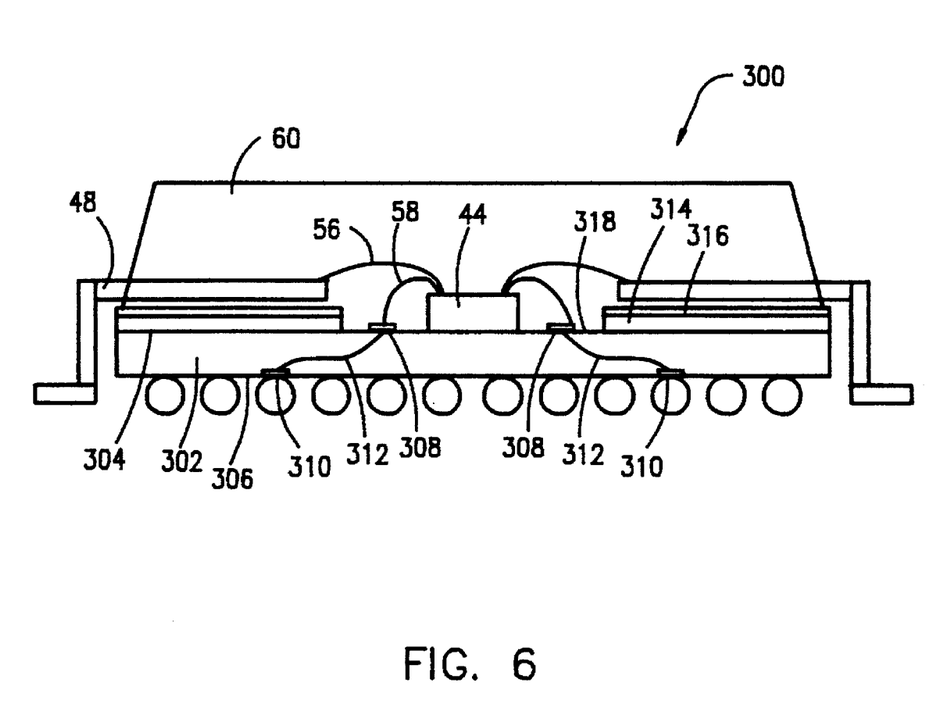
FIG. 6 is an elevational diagrammatic illustration of an integrated circuit assembly designed in accordance with another embodiment of the present invention which includes a flex tape substrate.

Referring now to FIG. 6, an assembly 300 designed in accordance with a further embodiment of the present invention is shown. Assembly 300 may be identical to assembly 30 illustrated in FIG. 2 and described above, with one exception. In the case of assembly 300, a dielectric flex tape substrate, indicated by reference numeral 302, is used. Flex tape substrate 302 may by made from a conventional material such as polymer flex tape material in the same manner as conventional flex tape substrates. Flex tape substrate 302 has a top surface 304 and a bottom surface 306 and its thickness is exaggerated for purposes of illustration. In actual practice it is much thinner than shown, for example, on the order of 2 mil thick. Flex tape substrate 302 also includes a plurality of terminal pads 308 on its top surface 304, an array of contact terminals 310 on its bottom surface 306, and a plurality of electrically conductive traces represented schematically by lines indicated by reference numeral 312. Each trace 312 electrically interconnects a respective one of the terminal pads 308 on the substrate's top surface to an associated contact terminal 310 on the substrate's bottom surface. As is the case with conventional flex tape substrates, traces 312 may be encapsulated within the polymer material making up the substrate, thereby electrically insulating the traces from one another and from other components. This arrangement eliminates the need for using an electrically nonconductive material such as insulating material 50 to electrically isolate leads 48 from traces 312 as was described above for assembly 30. Because flex tape substrates of this type are very thin compared to rigid substrate materials, this arrangement may be used to provide a thinner overall assembly compared to assembly 30 described above.

As described above, assembly 300 may include either solder balls 42 (as shown in FIG. 6) or solder columns 202 (as described above for FIG. 5) attached to contact terminals 310 in order to provide part of the arrangement for electrically connecting assembly 300 to other elements. Also, while not specifically shown, assembly 300 may include the same stacked arrangement of ground planes and/or power planes as was described above in detail and as illustrated in FIGS. 3, 3A, 4 and 4A.

In the embodiment illustrated in FIG. 6, assembly 300 further includes a stiffener member 314. Stiffener member 314 is made from a relatively rigid material and is attached to top surface 304 of flex tape substrate 302 in order to stiffen substrate 302 to provide a more rigid support for leads 48. Stiffener member 314 may also be made from a thermally conductive material such as aluminum or copper allowing stiffener member 314 to be used as a heat spreader. This arrangement would provide improved heat dissipation for assembly 300. As shown in FIG. 6, if stiffener member 314 is made from an electrically conductive material, an electrically non-conductive adhesive tape or epoxy 316 is used to attach leads 48 to stiffener member 314. This ensures leads 48 remain electrically isolated from one another. Also as shown in FIG. 6, stiffener member 314 may have a central opening 318 which provides space for die 44 to be attached directly to flex tape substrate 302 instead of being supported by stiffener member 314. By providing central opening 318, the overall thickness of the assembly does not need to be increased in any significant way when stiffener member 314 is used.

Still referring to FIG. 6, assembly 300 is assembled by first providing flex tape substrate 302. If a stiffener member 314 is to be included it is attached to the top surface of substrate 302. Next, leads 48 are attached to either flex tape substrate 302 or stiffener 314 depending on whether the stiffener has been included. If the stiffener is included and is made from an electrically conductive material, an electrically non-conductive material such as adhesive tape or epoxy 316 is used to attach leads 48 to stiffener 314. If a ground plane and/or a power plane are to be included, they are attached over leads 48 using a non-conductive adhesive material. Die 44 is then attached to flex tape substrate 302. Die 44 is electrically connected to leads 48 and terminal pads 308 (and the ground and/or power planes if included) using arrays of bonding wires 56 and 58 as described above for assembly 30. In this case, bonding wires 56 connect die 44 to leads 48 and bonding wires 58 connect die 44 to terminal pads 308 and therefore to contact terminals 310. Once the wire bonding is complete, encapsulating material 60 is used to encapsulate die 44, bonding wires 56 and 58, and portions of leads 48 and substrate 302. Solder balls 42, or as mentioned above solder columns 202, are then attached to contact terminals 310. Leads 48 are then bent into their final position such that leads 48 and solder balls 42 (or columns 202) provide an arrangement for electrically connecting die 44 to other electrical elements.

It should be understood that the present invention may be embodied in many other specific forms without departing from the spirit or scope of the invention. Therefore, the present examples are to be considered as illustrative and not restrictive, and the invention is not to be limited to the details given herein, but may be modified within the scope of the appended claims.

What is claimed is:

1. An integrated circuit package assembly comprising:
    a) a dielectric flex tape substrate having a horizontal top surface, a horizontal bottom surface, a plurality of contact terminals on the bottom surface of said flex tape substrate, a plurality of terminal pads on the top surface of said flex tape substrate, and a plurality of traces, each of said traces electrically connecting a respective one of said contact terminals on the bottom of said substrate to an associated one of said terminal pads on the top surface of said substrate;
    b) an integrated circuit die supported by said top surface of said flex tape substrate, said integrated circuit die including a plurality of input/output terminals;
    c) a plurality of electrically conductive leads supported by the top surface of said flex tape substrate and electrically isolated from said traces of said flex tape substrate, said electrically conductive leads being adapted to electrically connect certain ones of said plurality of input/output terminals of said integrated circuit die to external electrical elements;
    d) an array of electrically conductive contacts attached to said contact terminals on the bottom surface of said flex tape substrate, said contacts being adapted to electrically connect certain other ones of said plurality of input/output terminals of said integrated circuit die to external electrical elements;
    e) a first array of bonding wires electrically connecting said certain ones of said plurality of input/output ter-
minals of said integrated circuit die to associated ones of said electrically conductive leads supported on said top surface of said flex tape substrate;
    f) a second array of bonding wires electrically connecting said certain other ones of said plurality of input/output terminals of said integrated circuit die to associated ones of said terminal pads on said top surface of said flex tape substrate; and
    g) an encapsulating material integrally formed around and encapsulating at least the top surface of said flex tape substrate, said integrated circuit die, portions of said electrically conductive leads, and said first and second arrays of bonding wires.

2. An integrated circuit package assembly according to claim 1 further comprising a relatively rigid, stiffener member attached to the top surface of said flex tape substrate, said stiffener member supporting and being electrically isolated from said electrically conductive leads.

3. An integrated circuit package assembly according to claim 2 wherein said stiffener member is constructed of a thermally conductive material and also serves as a heat spreader for dissipating heat generated by said package.

4. An integrated circuit package assembly according to claim 2 wherein said flex tape substrate has a central portion which supports said integrated circuit die and a circumferential portion which supports said stiffener and wherein said stiffener has a centrally located opening which corresponds to the central portion of said flex tape substrate such that said integrated circuit die is supported by said flex tape substrate within the opening in said stiffener.

5. An integrated circuit package assembly according to claim 2 wherein said electrically conductive leads are attached to said stiffener member using an electrically insulating adhesive tape material.

6. An integrated circuit package assembly according to claim 2 wherein said electrically conductive leads are attached to said stiffener member using an electrically non conductive epoxy material.

7. An integrated circuit package assembly according to claim 1 wherein said integrated circuit die includes at least one power input/output terminal and wherein said integrated circuit package assembly further includes:
    a) an electrically conductive layer serving as a power plane supported by said flex tape substrate over at least some of said electrically conductive leads,
    b) means for electrically isolating said conductive layer from said underlying electrically conductive leads,
    c) at least one first bonding wire electrically connecting said conductive layer to said power input/output terminal of said integrated circuit die, and
    d) a second bonding wire electrically connecting said conductive layer to a preselected one of said electrically conductive leads or a preselected one of said traces.

8. An integrated circuit package assembly according to claim 1 wherein said integrated circuit die includes at least one ground input/output terminal and wherein said integrated circuit package assembly further includes:
    a) an electrically conductive layer which serves as a ground plane supported by said flex tape substrate over at least some of said electrically conductive leads,
    b) means for electrically insulating said conductive layer from said underlying electrically conductive leads,
    c) at least one first bonding wire electrically connecting said conductive layer to said ground input/output terminal of said integrated circuit die, and d) a second bonding wire electrically connecting said conductive layer to a preselected one of said electrically conductive leads or a preselected one of said traces.

9. An integrated circuit package assembly according to claim 1 wherein said integrated circuit die includes at least one power input/output terminal and at least one ground input/output terminal and wherein said integrated circuit package assembly further includes:

a) a first and a second electrically conductive planes which serve as power and ground planes respectively, said planes being positioned in stacked relationship with respect to one another on said flex tape substrate over at least some of said electrically conductive leads;

b) means for electrically insulating said planes from one another and from said electrically conductive leads thereunder;

c) means for electrically connecting said power and ground planes to specific ones of said traces or said electrically conductive leads, and d) means for electrically connecting said power and ground planes to respective ones of said power and ground input/output terminals on said integrated circuit die.

10. An integrated circuit package assembly according to claim 1 wherein said integrated circuit die includes additional input/output terminals and wherein said assembly further includes;

a) at least first and second electrically conductive layers positioned in stacked relationship to one another over at least some of said electrically conductive leads, b) means for insulating said layers from one another and from said leadframe leads, c) first means for electrically connecting said additional input/output terminals of said integrated circuit die to said first and second layers, respectively, in accordance with a predetermined circuit design, and d) second means for electrically connecting said layers to said traces or said electrically conductive leads, respectively, in accordance with said circuit design.

11. An integrated circuit package assembly according to claim 10 wherein at least one of said conductive layers is a ground plane.

12. An integrated circuit package assembly according to claim 10 wherein at least one of said conductive layers is a power plane.

13. An integrated circuit package assembly according to claim 10 wherein said insulating means further serves to bond said conductive layers to one another and to said flex tape substrate.

14. An integrated circuit package assembly according to claim 10 wherein said first and second means include bonding wires.

* * * * *